United States Patent
Menon et al.

(10) Patent No.: US 8,135,052 B2
(45) Date of Patent: Mar. 13, 2012

(54) FLEXIBLE MICROCAVITY STRUCTURE MADE OF ORGANIC MATERIALS USING SPIN-COATING TECHNIQUE AND METHOD OF MAKING

(75) Inventors: Vinod M. Menon, Princeton, NJ (US); Nikesh V. Valappil, Forest Hills, NY (US)

(73) Assignee: Research Foundation of the City University of New York, New York, NY (US)

( * ) Notice: Subject to any disclaimer, the term of this patent is extended or adjusted under 35 U.S.C. 154(b) by 63 days.

(21) Appl. No.: 12/746,069

(22) PCT Filed: Dec. 4, 2007

(86) PCT No.: PCT/US2007/024846
§ 371 (c)(1),
(2), (4) Date: Jun. 3, 2010

(87) PCT Pub. No.: WO2009/073002
PCT Pub. Date: Jun. 11, 2009

(65) Prior Publication Data
US 2010/0296543 A1 Nov. 25, 2010

(51) Int. Cl.
*H01S 3/08* (2006.01)
*H01S 5/00* (2006.01)
(52) U.S. Cl. .................. 372/92; 372/50.11; 372/50.124
(58) Field of Classification Search ............. 372/50.124, 372/92, 98–99
See application file for complete search history.

(56) References Cited

U.S. PATENT DOCUMENTS

| 5,260,957 | A | 11/1993 | Hakimi et al. |
| 6,160,830 | A | 12/2000 | Kiely et al. |
| 6,366,017 | B1 | 4/2002 | Antoniadis et al. |
| 6,436,613 | B1 | 8/2002 | Fallahi et al. |
| 6,498,802 | B1 * | 12/2002 | Chu et al. ......................... 372/39 |
| 2003/0031218 | A1 | 2/2003 | Yeh |
| 2003/0042850 | A1 | 3/2003 | Bertram et al. |
| 2005/0001538 | A1 * | 1/2005 | Ozkan et al. .................. 313/503 |
| 2005/0056859 | A1 * | 3/2005 | Liu et al. ....................... 257/103 |
| 2006/0289855 | A1 * | 12/2006 | Xie ................................. 257/19 |

FOREIGN PATENT DOCUMENTS

JP 2005055543 A * 3/2005

OTHER PUBLICATIONS

Machine Translation of JP2005-055543, Komikado, Mar. 2005.*
Komikado et al., "A Surface-Emitting Distributed-Feedback Dye Laser Fabricated by Spin-Coating Organic Polymers", Conference on Lasers & Electro-Optics (2005), pp. 2016-2018.
Winiarz et al., "Photogeneration, charge transport, and photoconductivity of a novel PVK/CdS-nanocrystal poymer composite", Chemical Physics, vol. 245, issues 1-3, (Jul. 1, 1999), abstract.

* cited by examiner

*Primary Examiner* — Jessica Stultz
*Assistant Examiner* — Phillip Nguyen
(74) *Attorney, Agent, or Firm* — Fish & Richardson P.C.

(57) ABSTRACT

A flexible microcavity structure made of organic materials using spin-coating technique for allowing large area structures using a roll-to-roll process. The structure includes at least one first polymer layer, at least one second polymer layer, and a cavity layer. The cavity layer has quantum dots embedded therein for realizing an electrically pumped microcavity emitter. The at least one first polymer layer alternates with the at least one second polymer layer, respectively, to form a pair of distributed Bragg reflecting mirrors. The cavity layer is sandwiched between the pair of distributed Bragg reflecting mirrors.

6 Claims, 2 Drawing Sheets

FLEXIBLE MICROCAVITY STRUCTURE MADE OF ORGANIC MATERIALS USING SPIN-COATING TECHNIQUE AND METHOD OF MAKING

CROSS REFERENCE TO PRIOR APPLICATIONS

This is a U.S. National Phase application under 35 U.S.C. §371 of International Patent Application No. PCT/US2007/024846, filed Dec. 4, 2007 which is incorporated by reference herein. The International Application published in English on Jun. 11, 2009 as WO 2009/073002 under PCT Article 21(2).

BACKGROUND OF THE INVENTION

1. Field of the Invention

The embodiments of the present invention relate to a flexible microcavity, and more particularly, the embodiments of the present invention relate to a flexible microcavity structure made of organic materials using spin-coating technique and method of making.

2. Description of the Prior Art

Microcavities helping confine electromagnetic radiation (light) is of utmost importance for realizing highly efficient lasers, single photon emitters, and displays. Indeed, efficient photonic devices, such as lasers, single photon sources, and novel displays have been realized using microcavities. Most of the microcavity structures were realized using techniques, such as molecular beam epitaxy, chemical vapor deposition, or sputtering. More recently a few groups have demonstrated microcavities using spin coating—a far simpler technique in comparison to the previous techniques. In the past, the inventors have shown enhanced spontaneous emission from quantum dots embedded in such microcavities.

Flexible microcavity was previously demonstrated using a commercially available reflector film from 3M acting as the bottom mirror and a metal mirror as the top mirror.[1]

[1] "All-organic flexible polymer microcavity light-emitting diodes using 3M reflective multilayer polymer mirrors," Appl. Phys. Lett. 87, 243504 (2005).

SUMMARY OF THE INVENTION

Thus, an object of the embodiments of the present invention is to provide a flexible microcavity structure made of organic materials using spin-coating technique, which avoids the disadvantages of the prior art.

Briefly stated, another object of the present invention is to provide a flexible microcavity structure made of organic materials using spin-coating technique for allowing large area structures using a roll-to-roll process. The structure includes at least one first polymer layer, at least one second polymer layer, and a cavity layer. The cavity layer has quantum dots embedded therein for realizing an electrically pumped microcavity emitter. The at least one first polymer layer alternates with the at least one second polymer layer, respectively, to form a pair of distributed Bragg reflecting mirrors. The cavity layer is sandwiched between the pair of distributed Bragg reflecting mirrors.

The novel features considered characteristic of the embodiments of the present invention are set forth in the appended claims. The embodiments of the present invention themselves, however, both as to their construction and their method of operation together with additional objects and advantages thereof will be best understood from the following description of the specific embodiments when read and understood in connection with the accompanying drawings.

BRIEF DESCRIPTION OF THE DRAWINGS

The figures of the drawings are briefly described as follows.

DETAILED DESCRIPTION OF THE PREFERRED EMBODIMENTS

General

In the embodiments of the present invention, there is developed a technique whereby spin-coated microcavities are easily peeled off a substrate, thereby forming a flexible microcavity.

Figure 1:
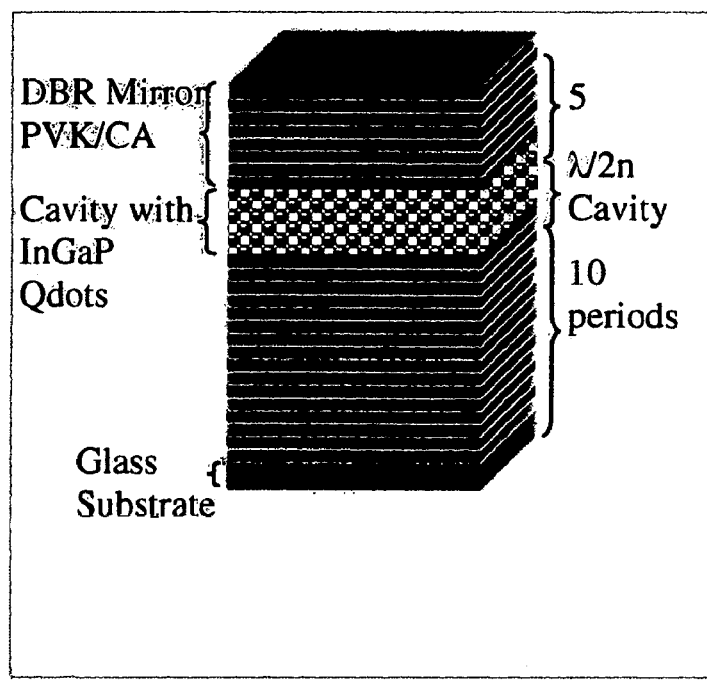
FIG. 1 is a schematic drawing of the solution processed polymer microcavity structure.

A schematic drawing of the microcavity structure of the embodiments of the present invention is shown generally in FIG. 1, which is a schematic drawing of the solution processed polymer microcavity structure.

Alternating layers of two polymers having different refractive indices are spin-coated to fabricate distributed Bragg reflecting (DBR) mirrors. It is important to choose the polymers so that a solvent dissolving one does not affect the other one. In the prototype demonstrated, polyvinyl carbazole (PVK) and cellulose acetate (CA) are used for the two layers. The refractive indices of PVK and CA are 1.683 and 1.475, respectively, at 650 nm. A cavity layer including quantum dots embedded in PVK is sandwiched between two DBR mirrors. The thickness of the cavity layer must be equal to an integer multiple of half the wavelength of emission of the QDs. In the embodiments of the present invention including InGaP. QDs, the emission wavelength was 670 nm. The microcavity structure includes the cavity layer between top and bottom DBRs having 5 and 10 periods, respectively. Lesser periods are used in the top mirror to have better light extraction from the top.

Method of Making

Poly-vinyl carbazol (PVK) polymer, with an index of refraction of 1.683, was dissolved in chlorobenzene to form a first layer, and cellulose acetate (CA) polymer, with an index of refraction of 1.475, was dissolved in di-acetone alcohol to form a second layer.

Alternating layers of the first layer and the second layer were spin-coated onto a glass substrate to create a pair of Distributed Bragg Reflecting (DBR) mirrors. The pair of DBR mirrors showed excellent uniformity in their optical properties over a 1 cm×1 cm sample. Spin-coating involves dropping a small amount of each first layer and each second layer onto a glass substrate and spin at high speeds to create uniformly thick layers. Then the sample is placed on a hot plate to evaporate any remaining solvent. By spin-coating alternating layers of the first layer and the second layer, a DBR mirror can be created with layers $\lambda/4n$ thick, where n is the index of refraction for the polymer and $\lambda$ is the wavelength of the quantum dot emission used in the cavity. One set of alternating first and second layers constitutes a period. Ten periods are built onto the glass substrate using spin speeds of 3150 RPM for the first layers and 5000 RPM for the second layers. The first layers were placed on a hotplate at 80° C. and the second layers at 120° C., each for 15 minutes.

A λ/2n thick defect layer containing InGaP Quantum Dots was formed above one of the pair of DBR mirrors, and an additional 5 periods of the other one of the pair of DBR mirrors were constructed and placed on the, defect layer.

Figure 2:
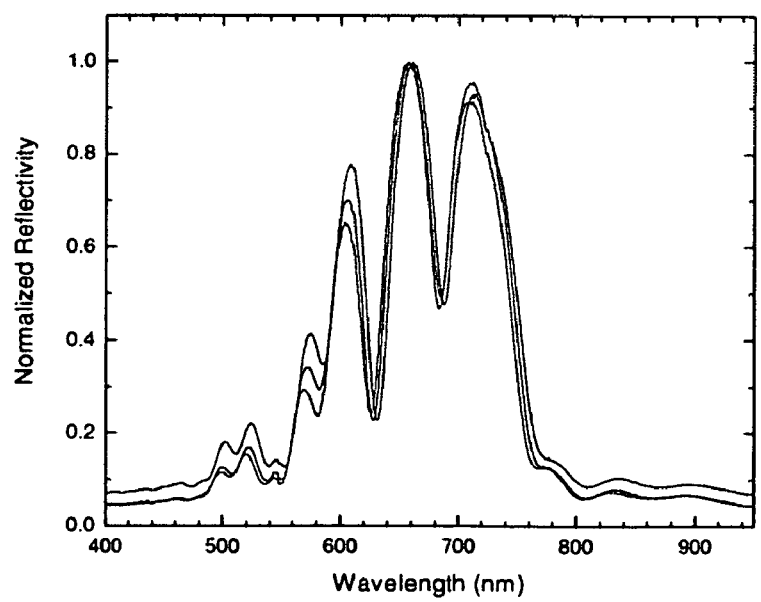
FIG. 2 is a graph of reflectivity of the solution processed microcavity at various locations on a 1 cm×1 cm sample.
Figure 3:
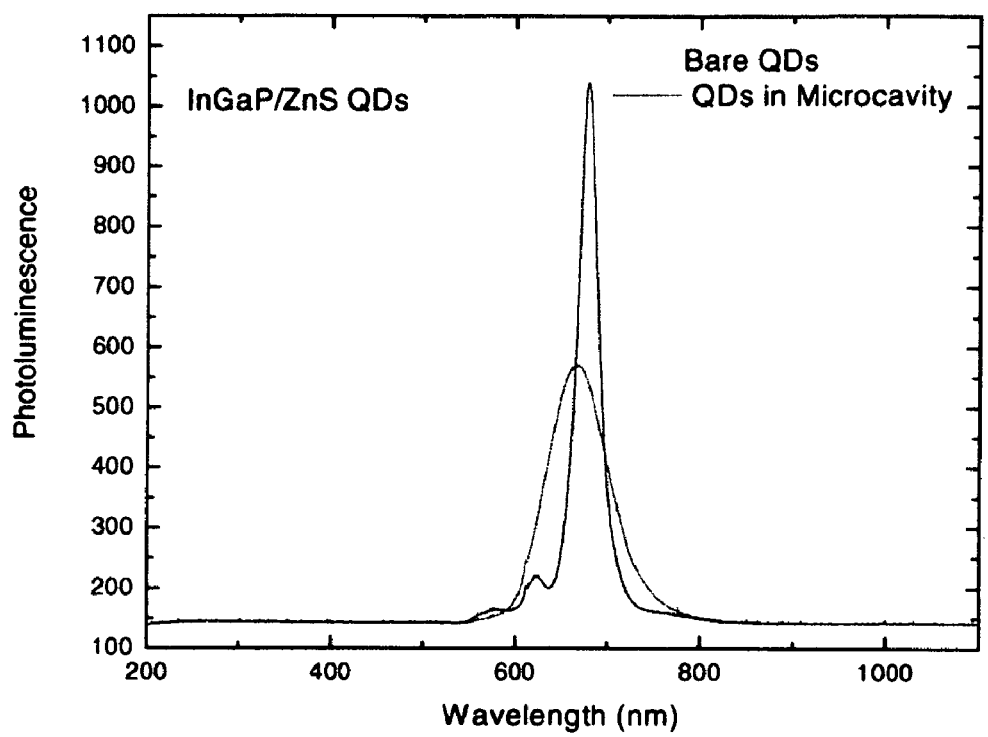
FIG. 3 is a graph of enhanced spontaneous emission observed from Qdots embedded the flexible microcavity, with the emission from bare Qdots shown for comparison.

Following the fabrication, the optical characteristics on the glass substrate were tested. The embodiments of the present invention demonstrated excellent uniformity in their optical properties over a 1 cm×1 cm sample, as shown in FIG. 2, which is a graph of reflectivity of the solution processed microcavity at various locations on a 1 cm×1 cm sample. The emission from the QDs embedded in the microcavity structure showed enhanced spontaneous emission evidenced by a significant reduction in the spectral width and increased intensity in comparison to the bare QDs. The emission from the microcavity also showed angle dependence as expected from any microcavity on a flat surface. Spectral narrowing observed from this microcavity is shown in FIG. 3, which is a graph of enhanced spontaneous emission observed from Qdots embedded the flexible microcavity, with the emission from bare Qdots shown for comparison. More recently samples with similar uniformity over 2.5 cm×2.5 cm have been demonstrated.

Figure 4:
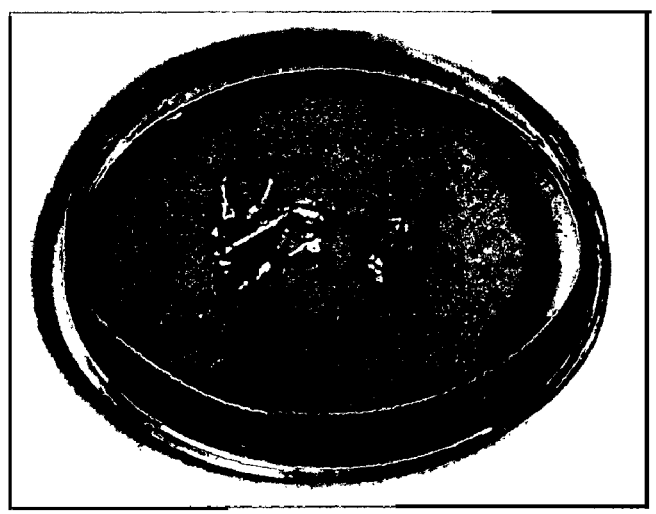
FIG. 4 is a photograph of the flexible microcavity.

Following the optical characterization of the microcavity of the glass substrate, the microcavity structure was peeled off the glass substrate using a sharp scalpel (sharp blade will work just as good). A photograph of the free standing microcavity structure is shown in FIG. 4, which is a photograph of the flexible microcavity.

Advantages

The entire structure is fabricated using spin-coating. This allows the realization of large area structures using a roll-to-roll process.

The exact reflectivity and the cavity quality factors can be controlled by altering the layer thicknesses, and the number of periods and the type of polymer.

The choice of the polymer allows one to alter the stop band width of the Bragg mirror.

It is also possible to realize an electrically pumped microcavity emitter with embedded Qdots.

Conclusion

It will be understood that each of the elements described above or two or more together may also find a useful application in other types of constructions differing from the types described above.

While the embodiments of the present invention have been illustrated and described as embodied in a flexible microcavity structure made of organic materials using spin-coating technique, however, they are not limited to the details shown, since it will be understood that various omissions, modifications, substitutions, and changes in the forms and details of the embodiments of the present invention illustrated and their operation can be made by those skilled in the art without departing in any way from the spirit of the embodiments of the present invention.

Without further analysis, the foregoing will so fully reveal the gist of the embodiments of the present invention that others can by applying current knowledge readily adapt it for various applications without omitting features that from the standpoint of prior art fairly constitute characteristics of the generic or specific aspects of the embodiments of the present invention.

The invention claimed is:

1. A flexible microcavity structure made of organic materials using spin-coating technique allowing large area structures using a roll-to-roll process, comprising:
 a) at least one first polymer layer;
 b) at least one second polymer layer; and
 c) a cavity layer of polyvinyl carbazole;
 wherein said cavity layer has quantum dots embedded therein for realizing an electrically pumped microcavity emitter, said quantum dots including InGaP and having an emission with a wavelength of 670 nm, and said cavity layer having a thickness equal to an integer multiple of half said wavelength of said emission of said quantum dots;
 wherein each of said at least one first polymer layer alternates with said at least one second polymer layer to form a pair of distributed Bragg reflecting mirrors; and
 wherein said cavity layer is sandwiched between said pair of distributed Bragg reflecting mirrors.

2. The structure of claim 1, wherein a first polymer chosen for said at least one first polymer layer and a second polymer chosen for said at least one second polymer layers are not dissolvable in the same solvent so as to prevent the solvent dissolving one polymer from dissolving the other polymer.

3. The structure of claim 1, wherein said first polymer used for said at least one first polymer layer is polyvinyl carbazole; and
 wherein said second polymer used for said at least one second polymer layer is cellulose acetate.

4. The structure of claim 1, wherein a lower one of said pair of distributed Bragg reflecting mirrors has ten periods; and
 wherein an upper one of said pair of distributed Bragg reflecting mirrors has five periods for better light extraction from said upper one of said pair of distributed Bragg reflecting mirrors.

5. The structure of claim 2, wherein each of said pair of distributed Bragg reflecting mirrors has a stop bandwidth; and
 wherein said first polymer and said second polymer are chosen to allow alteration of said stop bandwidth of each of said pair of distributed Bragg reflecting mirrors.

6. The structure of claim 1, wherein exact reflectivity and quality factors of said cavity layer is controlled by altering one of layer thicknesses, number of periods, and type of polymer.

* * * * *